United States Patent
Kang et al.

(10) Patent No.: US 12,044,961 B2
(45) Date of Patent: Jul. 23, 2024

(54) METHOD OF FORMING MASK INCLUDING CURVILINEAR SHAPE AND METHOD OF FORMING SEMICONDUCTOR DEVICE

(71) Applicant: Samsung Electronics Co., Ltd., Suwon-si (KR)

(72) Inventors: Pilsoo Kang, Hwaseong-si (KR); Wonchan Lee, Hwaseong-si (KR); Sangwook Kim, Yongin-si (KR); Sungyong Moon, Seoul (KR); Seunghune Yang, Seoul (KR); Jeeeun Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 338 days.

(21) Appl. No.: 17/188,140

(22) Filed: Mar. 1, 2021

(65) Prior Publication Data

US 2022/0050376 A1 Feb. 17, 2022

(30) Foreign Application Priority Data

Aug. 12, 2020 (KR) .................. 10-2020-0101059

(51) Int. Cl.
*G03F 1/70* (2012.01)
*G03F 1/24* (2012.01)
*G03F 1/36* (2012.01)
*H01L 21/033* (2006.01)

(52) U.S. Cl.
CPC .............. *G03F 1/70* (2013.01); *G03F 1/24* (2013.01); *H01L 21/0334* (2013.01); *G03F 1/36* (2013.01)

(58) Field of Classification Search
CPC ..... G03F 1/70; G03F 1/24; G03F 1/36; G03F 1/22; H01L 21/0334; H01L 21/027
See application file for complete search history.

(56) References Cited

U.S. PATENT DOCUMENTS

| | | | |
|---|---|---|---|
| 6,680,150 B2 | 1/2004 | Blatchford et al. | |
| 7,001,693 B2 | 2/2006 | Liebmann et al. | |
| 7,297,628 B2 | 11/2007 | Chao et al. | |
| 7,539,954 B2 | 5/2009 | Adam | |
| 7,939,222 B2 | 5/2011 | Chen et al. | |
| 8,017,288 B2 | 9/2011 | Fujimura et al. | |
| 8,413,083 B2 | 4/2013 | Tan et al. | |
| 8,637,211 B2 * | 1/2014 | Fujimura | G06F 30/398 430/30 |
| 10,001,698 B2 | 6/2018 | Chang | |
| 10,877,380 B1 * | 12/2020 | Lin | G03F 1/36 |
| 2011/0183239 A1 * | 7/2011 | Park | G03F 1/22 430/5 |
| 2019/0163049 A1 * | 5/2019 | Beylkin | G03F 1/70 |
| 2020/0363713 A1 * | 11/2020 | Hsu | G03F 1/36 |
| 2020/0387660 A1 * | 12/2020 | Cecil | G03F 1/36 |

\* cited by examiner

*Primary Examiner* — Nghia M Doan
(74) *Attorney, Agent, or Firm* — Myers Bigel, P.A.

(57) ABSTRACT

A mask forming method includes providing preliminary mask data including a Manhattan path such as a quadrangle, a bar, a polygon or a combination thereof based on a layout. Mask data including a curvilinear shape is prepared by correcting the preliminary mask data through application of an elliptical function, a B-spline curve, or a combination thereof. A mask pattern is formed on a mask substrate based on the mask data.

19 Claims, 12 Drawing Sheets

METHOD OF FORMING MASK INCLUDING CURVILINEAR SHAPE AND METHOD OF FORMING SEMICONDUCTOR DEVICE

CROSS-REFERENCE TO THE RELATED APPLICATION

This U.S. non-provisional patent application claims priority from Korean Patent Application No. 10-2020-0101059, filed on Aug. 12, 2020, in the Korean Intellectual Property Office, the disclosure of which is incorporated herein by reference in its entirety.

FIELD

Embodiments of the disclosure relate to a method of forming a mask including a curvilinear shape, a method of forming a semiconductor device using the mask, and a mask forming system.

BACKGROUND

In accordance with high integration of a semiconductor device, advanced lithography processes are being developed. In order to achieve a smaller geometrical size, use of an extreme ultraviolet (EUV) lithography process has been proposed. An EUV lithography system uses a reflective optical device and an EUV lithography mask for execution of a lithography process. The EUV lithography mask has encountered various technical limitations.

SUMMARY

Some embodiments of the disclosure provide an efficient mask forming method, a mask formed using the forming method, a method of forming a semiconductor device using the mask, and a mask forming system.

A mask forming method according to example embodiments of the disclosure includes providing preliminary mask data including a Manhattan path that defines a quadrangle, a bar, a polygon, or a combination thereof based on a layout. Mask data including a curvilinear shape is prepared by correcting the preliminary mask data through application of an elliptical function, a B-spline curve, or a combination thereof. A mask pattern is formed on a mask substrate based on the mask data.

An extreme ultraviolet (EUV) lithography mask formed by the mask forming method according to the example embodiments of the disclosure may be provided.

A semiconductor device forming method according to example embodiments of the disclosure includes forming a mask, and forming a plurality of semiconductor patterns on a semiconductor substrate using the mask. The forming the mask includes providing preliminary mask data including a Manhattan path that defines a quadrangle, a bar, a polygon, or a combination thereof, based on a layout. Mask data including a curvilinear shape is prepared by correcting the preliminary mask data through application of an elliptical function, a B-spline curve, or a combination thereof. A mask pattern is formed on the mask substrate based on the mask data.

A mask forming method according to example embodiments of the disclosure includes providing a preliminary mask data including a Manhattan path that defines a quadrangle, a bar, a polygon, or a combination thereof based on a layout. Mask data including a curvilinear shape is prepared by correcting the preliminary mask data through application of at least two selected from the group consisting of an elliptical function, a B-spline curve, and inverse lithography technology (ILT). A mask pattern is formed on a mask substrate based on the mask data.

A mask forming system according to example embodiments of the disclosure includes a preliminary mask data producing device configured to provide preliminary mask data based on a layout that is input from a layout designing device. A mask data producing device is configured to prepare mask data including a curvilinear shape by correcting the preliminary mask data through application of at least one selected from the group consisting of an elliptical function and a B-spline curve, or application of at least two selected from the group consisting of the elliptical function, the B-spline curve, and inverse lithography technology (ILT). A mask pattern forming device is configured to form a mask pattern on a mask substrate based on the mask data.

DETAILED DESCRIPTION OF EXAMPLE EMBODIMENTS

Figure 1:
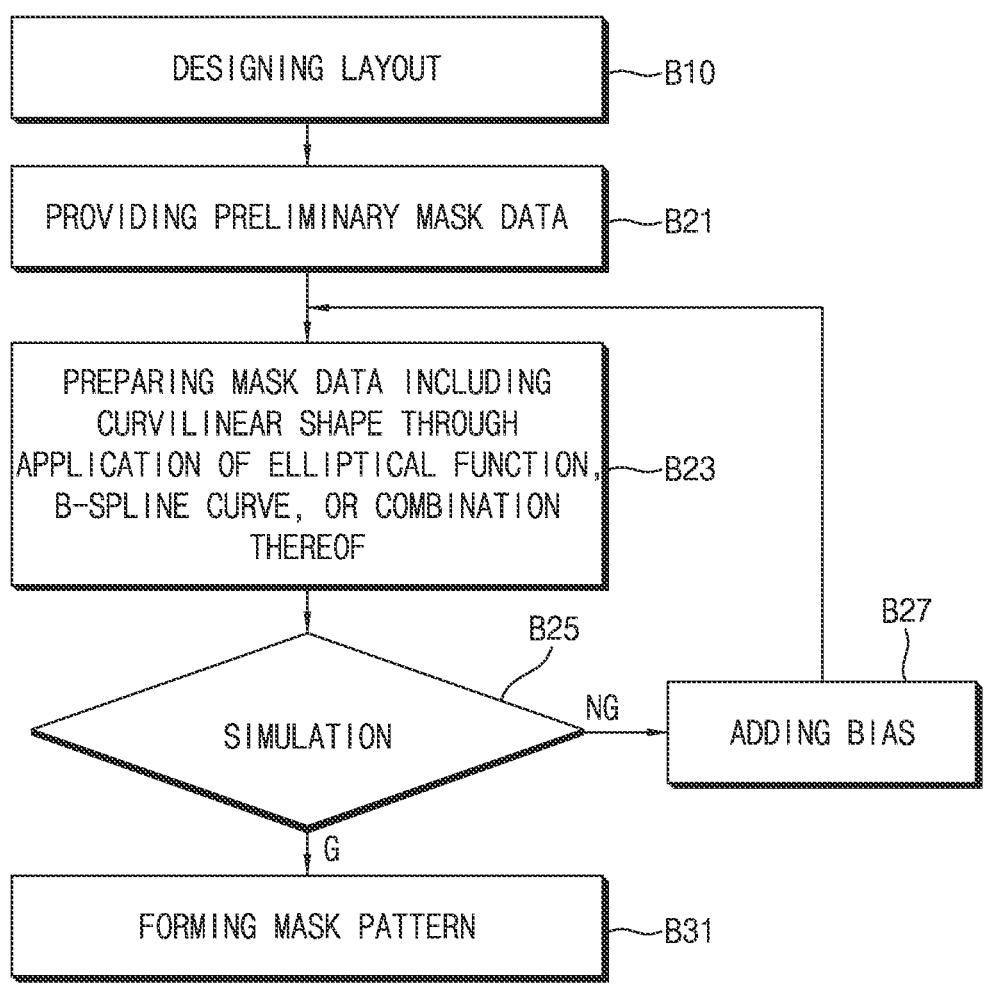
FIG. 1 is a flowchart illustrating a mask forming method according to example embodiments of the disclosure.

FIG. 1 is a flowchart illustrating a mask forming method according to example embodiments of the disclosure. The terms first, second, etc. may be used herein merely to differentiate one element from another. The term "and/or" may refer to any and all combinations of listed elements.

Referring to FIG. 1, the mask forming method according to the example embodiments of the disclosure may include designing a layout (B10), providing preliminary mask data including a Manhattan path such as a quadrangle, a bar, a polygon, or a combination thereof on the basis of the layout (B21), preparing mask data including a curvilinear shape by correcting the preliminary mask data through application of an elliptical function, a B-spline curve, or a combination thereof (B23), simulating the mask data (B25), adding a bias to the preliminary mask data (B27), and forming a mask pattern on a mask substrate on the basis of the mask data (B31). Provision of the preliminary mask data (B21), preparation of the mask data (B23), simulation of the mask data (B25), and addition of the bias (B27) may correspond to optical proximity correction (OPC).

The elliptical function may include an ellipse or a superellipse. The ellipse may be a curve formed by a set of all points in a plane, the sum of whose distances from two fixed points in the plane is constant. The superellipse may be a closed curve resembling the ellipse, retaining the geometric features of semi-major axis and semi-minor axis, and symmetry about them, but a different overall shape.

The B-spline curve may be a smooth curve defined at several given points. The B-spline curve has a property that, even when a part of control points is varied, this variation does not influence the entirety of the curve, because the B-spline curve is expressed by separate polynomials on a segment basis.

The bias may include partial addition of a quadrangle, partial deletion of a quadrangle, a hammer-head, a serif, a jog, or a combination thereof.

In an embodiment, the mask forming method according to the example embodiments of the disclosure may include designing a layout (B10), providing preliminary mask data on the basis of the layout (B21), preparing mask data including a curvilinear shape by correcting the preliminary mask data through application of an elliptical function, a B-spline curve, or a combination thereof (B23), simulating the mask data (B25), and forming a mask pattern on a mask substrate on the basis of the mask data when an expected contour satisfies a tolerance range of a desired pattern, based on results of the simulation (G), (B31).

In an embodiment, the mask forming method according to the example embodiments of the disclosure may include designing a layout (B10), providing preliminary mask data on the basis of the layout (B21), preparing first mask data including a first curvilinear shape by correcting the preliminary mask data through application of a first elliptical function, a first B-spline curve, or a combination thereof (B23), simulating the first mask data (B25), and adding a bias to the preliminary mask data when a first expected contour does not satisfy a tolerance range of a desired pattern, based on results of the simulation (NG), (B27), preparing second mask data including a second curvilinear shape by correcting the bias-added preliminary mask data through application of a second elliptical function, a second B-spline curve, or a combination thereof (B23), simulating the second mask data (B25), and forming a mask pattern on a mask substrate on the basis of the second mask data when a second expected contour satisfies the tolerance range of the desired pattern, based on the results of the simulation (G), (B31).

In an embodiment, addition of the bias to the preliminary mask data (B27), preparation of the second mask data (B23), and simulation of the second mask data (B25) performed when the first expected contour does not satisfy the tolerance range of the desired pattern, based on results of the simulation (NG), may be iterated or repeated a plurality of times until the second expected contour satisfies the tolerance range of the desired pattern. That is, preparing the mask data including the curvilinear shape (B23) may be an iterative process involving one or more simulation operations (B25) and bias addition operations (B27) depending on the results of the simulation operations (B25).

FIGS. 2 to 8 are layouts illustrating the mask forming method according to the example embodiments of the disclosure.

Figure 2:
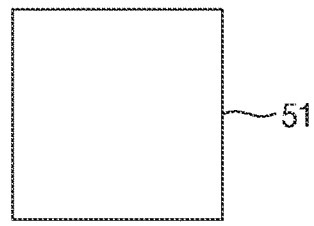
FIGS. 2 to 22 are layouts illustrating the mask forming method according to example embodiments of the disclosure.

Referring to FIGS. 1 and 2, preliminary mask data 51 including a Manhattan path such as a quadrangle, a bar, a polygon, or a combination thereof may be provided on the basis of a layout (B21). In an embodiment, the preliminary mask data 51 may include a quadrangle. In an embodiment, the preliminary mask data 51 may include a square.

Figure 3:
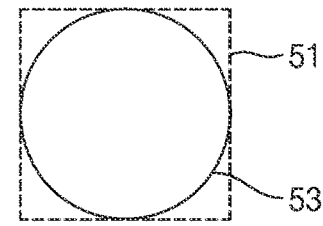

Referring to FIGS. 1 and 3, first mask data 53 including a first curvilinear shape may be prepared by correcting the preliminary mask data 51 through application of a first elliptical function, a first B-spline curve, or a combination thereof (B23). In an embodiment, the first mask data 53 including the first curvilinear shape may include an ellipse inscribed in the quadrangle. In an embodiment, the first mask data 53 may include a circle inscribed in the quadrangle.

Figure 4:
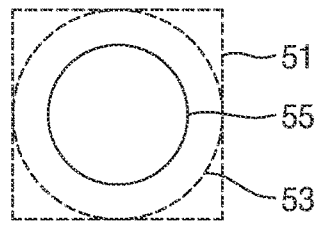

Referring to FIGS. 1 and 4, the first mask data 53 may be simulated (B25). The simulation may include acquiring, from the first mask data 53, a first expected contour 55 formable on a semiconductor substrate, and verifying whether or not the first expected contour 55 is within a tolerance range of a desired pattern. In an embodiment, the first expected contour 55 may include an ellipse smaller than the first mask data 53. In an embodiment, the first expected contour 55 may include a circle smaller than the first mask data 53.

In an embodiment, verification of the first expected contour 55 may include checking whether or not the first expected contour 55 is suitable for an edge placement error (EPE) tolerance. Verification of the first expected contour 55 may include mask rule check (MRC).

Figure 5:
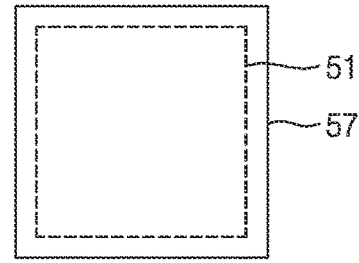

Referring to FIGS. 1 and 5, when the first expected contour 55 does not satisfy the tolerance range of the desired pattern, based on results of the simulation (NG), a bias may be added to the preliminary mask data 51 (B27). In an embodiment, the bias-added preliminary mask data 57 may include a quadrangle greater than the preliminary mask data 51 in one or more dimensions.

Figure 6:
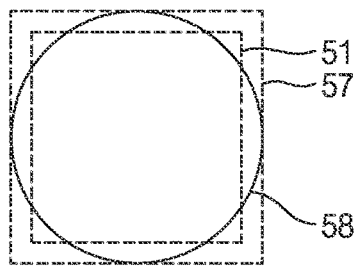

Referring to FIGS. 1 and 6, second mask data 58 including a second curvilinear shape may be prepared by correcting the bias-added preliminary mask data 57 through application of a second elliptical function, a second B-spline curve, or a combination thereof (B23). In an embodiment, the second mask data 58 may include an ellipse inscribed in the bias-added preliminary mask data 57, or a portion of an ellipse adjacent an edge of the preliminary mask data 51. In an embodiment, the second mask data 58 may include a circle inscribed in the bias-added preliminary mask data 57.

Figure 7:
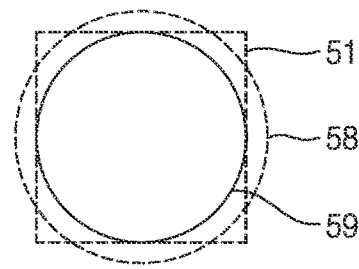

Referring to FIGS. 1 and 7, the second mask data 58 may be simulated (B25). The simulation may include acquiring, from the second mask data 58, a second expected contour 59 formable on a semiconductor substrate, and verifying whether or not the second expected contour 59 is within a tolerance range of a desired pattern. In an embodiment, the second expected contour 59 may include an ellipse smaller than the second mask data 58. In an embodiment, the second expected contour 59 may include a circle smaller than the second mask data 58. In an embodiment, verification of the second expected contour 59 may include verifying whether or not the second expected contour 59 is suitable for an EPE tolerance. Verification of the second expected contour 59 may include MRC.

In an embodiment, addition of the bias to the preliminary mask data 51 (B27), preparation of the second mask data 58 (B23), and simulation of the second mask data 58 (B25) performed when the first expected contour 55 does not satisfy the tolerance range of the desired pattern, based on results of the simulation (NG), may be iterated or repeated a plurality of times until the second expected contour 59 satisfies the tolerance range of the desired pattern.

Figure 8:
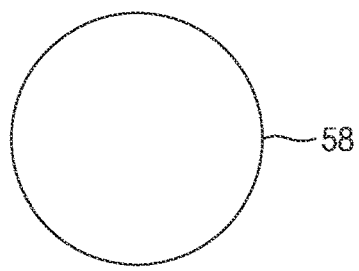

Referring to FIGS. 1 and 8, when the second expected contour 59 satisfies the tolerance range of the desired pattern (G), a mask pattern may be formed on the mask substrate on the basis of the second mask data 58 (B31).

In an embodiment, when the first expected contour 55 satisfies the tolerance range of the desired pattern, based on the results of the simulation (G), a mask pattern may be formed on the mask substrate on the basis of the first mask data 53 (B31).

FIGS. 9 to 15 are layouts illustrating a mask forming method according to example embodiments of the disclosure.

Figure 9:
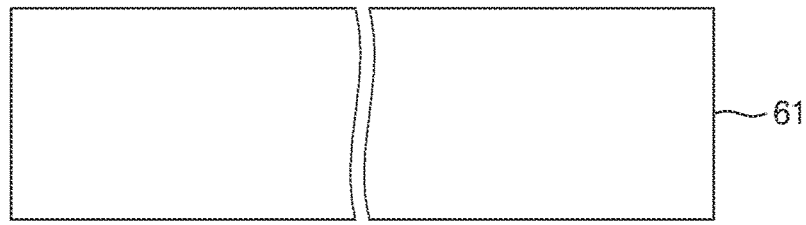

Referring to FIGS. 1 and 9, preliminary mask data 61 including a Manhattan path such as a quadrangle, a bar, a polygon, or a combination thereof on the basis of a layout may be provided (B21). In an embodiment, the preliminary mask data 61 may include a bar or a quadrangle.

Figure 10:
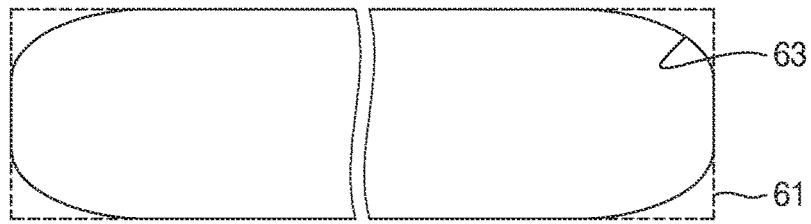

Referring to FIGS. 1 and 10, first mask data 63 including a first curvilinear shape may be prepared by correcting the preliminary mask data 61 through application of a first elliptical function, a first B-spline curve, or a combination thereof (B23). In an embodiment, the first mask data 63 including the first curvilinear shape may include a portion of an ellipse inscribed on edges of the bar or the quadrangle.

Figure 11:
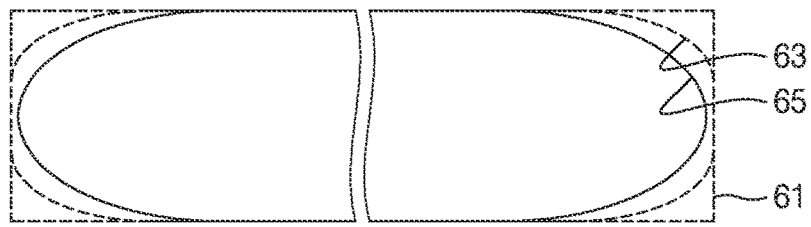

Referring to FIGS. 1 and 11, the first mask data 63 may be simulated (B25). The simulation may include acquiring, from the first mask data 63, a first expected contour 65 formable on a semiconductor substrate, and verifying whether or not the first expected contour 65 is within a tolerance range of a desired pattern. In an embodiment, the first expected contour 65 may include a shape smaller than the first mask data 63. In an embodiment, verification of the first expected contour 65 may include checking whether or not the first expected contour 65 is suitable for an EPE tolerance. Verification of the first expected contour 65 may include MRC.

Figure 12:
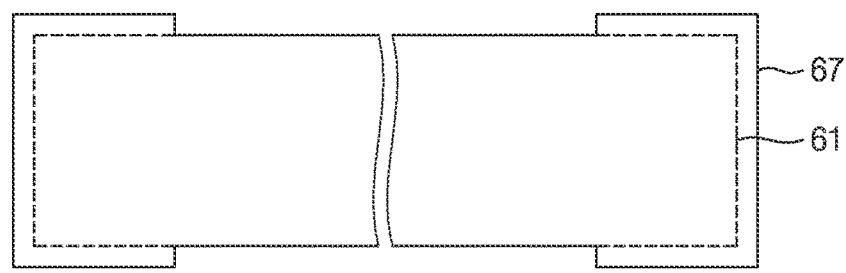

Referring to FIGS. 1 and 12, when the first expected contour 65 does not satisfy the tolerance range of the desired pattern, based on results of the simulation (NG), a bias may be added to the preliminary mask data 61 (B27). In an embodiment, the bias-added preliminary mask data 67 may include a bar partially greater than the preliminary mask data 61 or a polygon partially greater than the preliminary mask data 61 in one or more dimensions.

Figure 13:
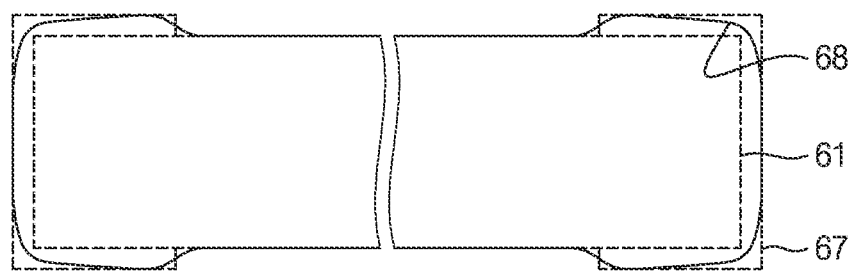

Referring to FIGS. 1 and 13, second mask data 68 including a second curvilinear shape may be prepared by correcting the bias-added preliminary mask data 67 through application of a second elliptical function, a second B-spline curve, or a combination thereof (B23). In an embodiment, the second mask data 68 may include a portion of an ellipse adjacent to edges of the bias-added preliminary mask data 67. That is, the shape defined by the second mask data may include rounded edges as compared to the shape defined by the bias-added preliminary mask data 67.

Figure 14:
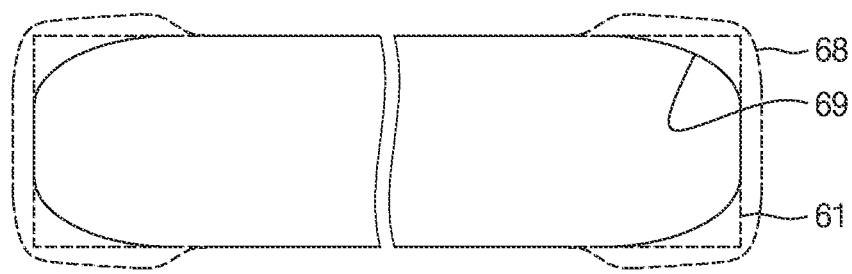

Referring to FIGS. 1 and 14, the second mask data 68 may be simulated (B25). The simulation may include acquiring, from the second mask data 68, a second expected contour 69 formable on a semiconductor substrate, and verifying whether or not the second expected contour 69 is within a tolerance range of a desired pattern. In an embodiment, the second expected contour 69 may include a shape smaller than the second mask data 68. In an embodiment, verification of the second expected contour 69 may include verifying whether or not the second expected contour 69 is suitable for an EPE tolerance. Verification of the second expected contour 69 may include MRC.

In an embodiment, addition of the bias to the preliminary mask data 61 (B27), preparation of the second mask data 68 (B23), and simulation of the second mask data 68 (B25) as performed when the first expected contour 65 does not satisfy the tolerance range of the desired pattern based on results of the simulation (NG), may be iterated or repeated a plurality of times until the second expected contour 69 satisfies the tolerance range of the desired pattern.

Figure 15:
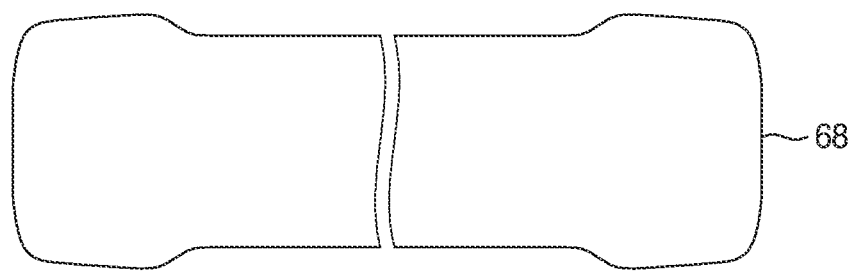

Referring to FIGS. 1 and 15, when the second expected contour 69 satisfies the tolerance range of the desired pattern (G), a mask pattern may be formed on the mask substrate on the basis of the second mask data 68 (B31).

In an embodiment, when the first expected contour 65 satisfies the tolerance range of the desired pattern based on the results of the simulation (G), a mask pattern may be formed on the mask substrate on the basis of the first mask data 63 (B31). That is, the operations for adding bias (B27), preparing the second mask data (B23), and simulating the second mask data (B25) may not be performed when the first expected contour 65 satisfies the tolerance range of the desired pattern.

FIGS. 16 to 22 are layouts illustrating a mask forming method according to example embodiments of the disclosure.

Figure 16:
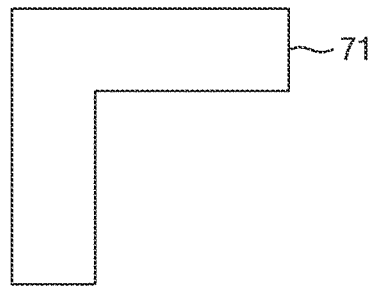

Referring to FIGS. 1 and 16, preliminary mask data 71 including a Manhattan path such as a quadrangle, a bar, a polygon, or a combination thereof on the basis of a layout may be provided (B21).

Figure 17:
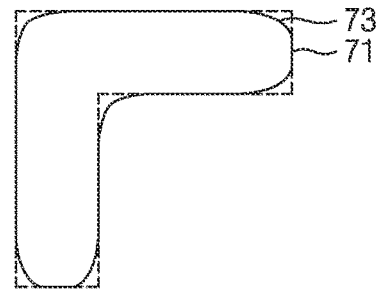

Referring to FIGS. 1 and 17, first mask data 73 including a first curvilinear shape may be prepared by correcting the preliminary mask data 71 through application of a first elliptical function, a first B-spline curve, or a combination thereof (B23). In an embodiment, the first mask data 73 including the first curvilinear shape may include a portion of an ellipse adjacent to edges of the Manhattan path. That is, the shape defined by the first mask data may include rounded edges as compared to the shape defined by the preliminary mask data.

Figure 18:
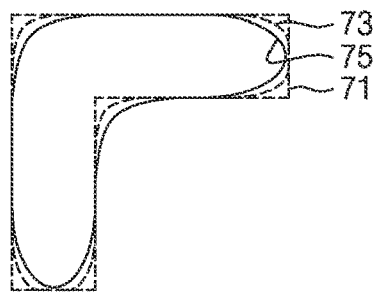

Referring to FIGS. 1 and 18, the first mask data 73 may be simulated (B25). The simulation may include acquiring, from the first mask data 73, a first expected contour 75 formable on a semiconductor substrate, and verifying whether or not the first expected contour 75 is within a tolerance range of a desired pattern. In an embodiment, the first expected contour 75 may include a shape smaller than the first mask data 73. In an embodiment, verification of the first expected contour 75 may include checking whether or not the first expected contour 75 is suitable for an EPE tolerance. Verification of the first expected contour 75 may include MRC.

Figure 19:
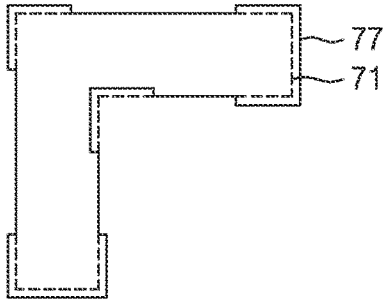

Referring to FIGS. 1 and 19, when the first expected contour 75 does not satisfy the tolerance range of the desired pattern, based on results of the simulation (NG), a bias may be added to the preliminary mask data 71 (B27). In an embodiment, the bias-added preliminary mask data 77 may include a Manhattan path partially greater than the preliminary mask data 71 in one or more dimensions.

Figure 20:
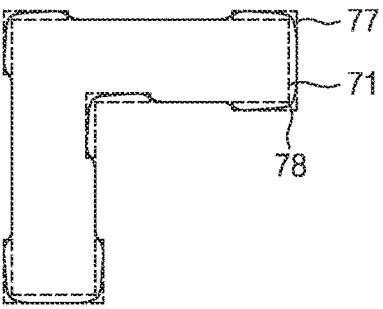

Referring to FIGS. 1 and 20, second mask data 78 including a second curvilinear shape may be prepared by correcting the bias-added preliminary mask data 77 through application of a second elliptical function, a second B-spline curve, or a combination thereof (B23). In an embodiment, the second mask data 78 may include a portion of an ellipse adjacent to edges of the bias-added preliminary mask data 77. That is, the shape defined by the second mask data may include rounded edges as compared to the shape defined by the bias-added preliminary mask data.

Figure 21:
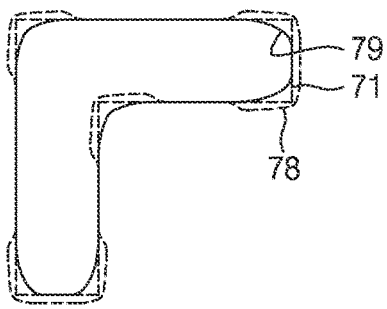

Referring to FIGS. 1 and 21, the second mask data 78 may be simulated (B25). The simulation may include acquiring, from the second mask data 78, a second expected contour 79 formable on a semiconductor substrate, and verifying whether or not the second expected contour 69 is within a tolerance range of a desired pattern. In an embodiment, the second expected contour 79 may include a shape smaller than the second mask data 78. In an embodiment, verification of the second expected contour 79 may include verifying whether or not the second expected contour 79 is suitable for an EPE tolerance. Verification of the second expected contour 79 may include MRC.

In an embodiment, addition of the bias to the preliminary mask data 71 (B27), preparation of the second mask data 78 (B23), and simulation of the second mask data 78 (B25) as performed when the first expected contour 75 does not satisfy the tolerance range of the desired pattern based on results of the simulation (NG), may be iterated or repeated a plurality of times until the second expected contour 79 satisfies the tolerance range of the desired pattern.

Figure 22:
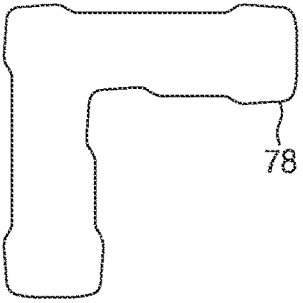

Referring to FIGS. 1 and 22, when the second expected contour 79 satisfies the tolerance range of the desired pattern (G), a mask pattern may be formed on the mask substrate on the basis of the second mask data 78 (B31).

In an embodiment, when the first expected contour 75 satisfies the tolerance range of the desired pattern based on the results of the simulation (G), a mask pattern may be formed on the mask substrate on the basis of the first mask data 73 (B31). That is, the operations for adding bias (B27), preparing the second mask data (B23), and simulating the second mask data (B25) may not be performed when the first expected contour 75 satisfies the tolerance range of the desired pattern.

Figure 23:
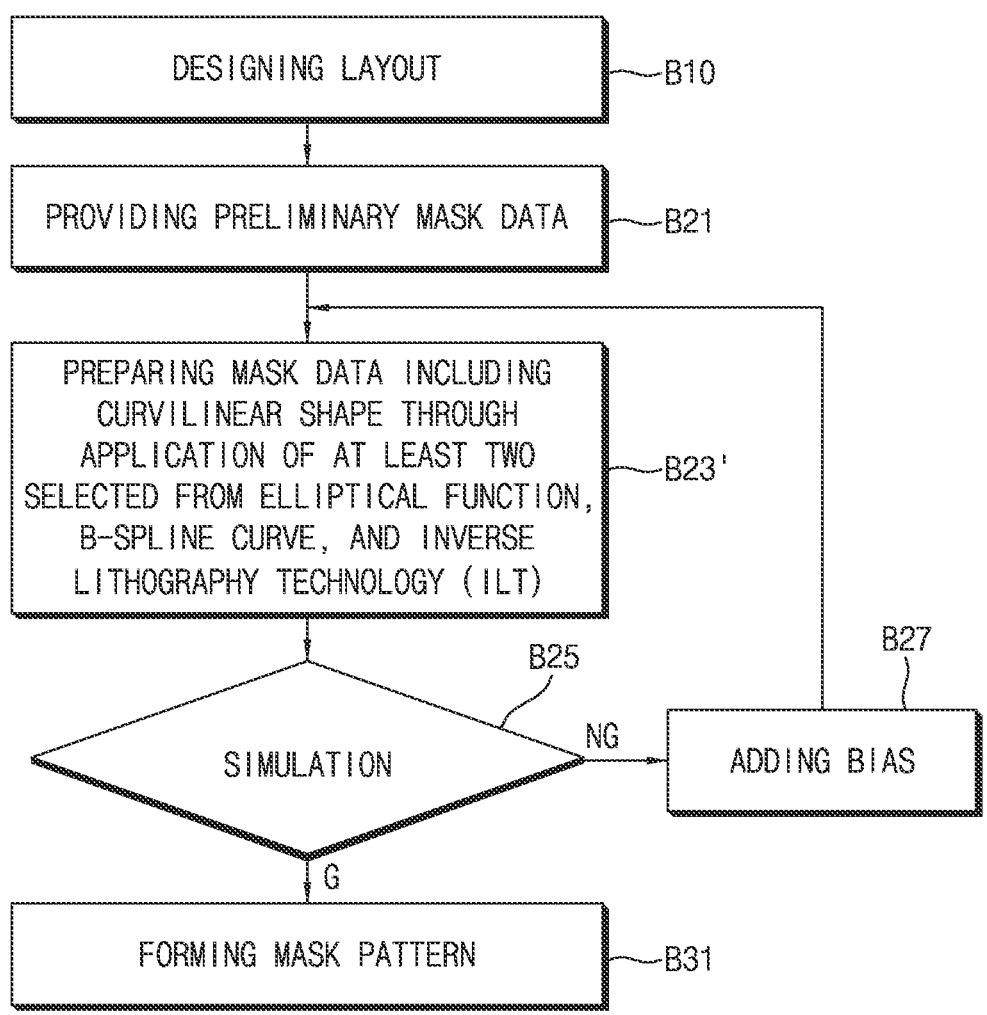
FIG. 23 is a flowchart illustrating a mask forming method according to example embodiments of the disclosure.

FIG. 23 is a flowchart illustrating a mask forming method according to example embodiments of the disclosure.

Referring to FIG. 23, the mask forming method according to the example embodiments of the disclosure may include designing a layout (B10), providing preliminary mask data including a Manhattan path such as a quadrangle, a bar, a polygon, or a combination thereof on the basis of the layout (B21), preparing mask data including a curvilinear shape by correcting the preliminary mask data through application of at least two selected from an elliptical function, a B-spline curve, and inverse lithography technology (ILT) (B23'), simulating the mask data (B25), adding a bias to the preliminary mask data (B27), and forming a mask pattern on a mask substrate on the basis of the mask data (B31).

In an embodiment, the mask forming method according to the example embodiments of the disclosure may include designing a layout (B10), providing preliminary mask data on the basis of the layout (B21), preparing mask data including a curvilinear shape by correcting the preliminary mask data through application of at least two selected from an elliptical function, a B-spline curve, and inverse lithography technology (ILT) (B23'), simulating the mask data (B25), and forming a mask pattern on a mask substrate on the basis of the mask data when an expected contour satisfies a tolerance range of a desired pattern, based on results of the simulation (G), (B31).

In an embodiment, the mask forming method according to the example embodiments of the disclosure may include designing a layout (B10), providing preliminary mask data, providing preliminary mask data on the basis of the layout (B21), preparing first mask data including a first curvilinear shape by correcting the preliminary mask data through application of at least two selected from a first elliptical function, a first B-spline curve, and first inverse lithography technology (ILT) (B23'), simulating the first mask data (B25), adding a bias to the preliminary mask data when a first expected contour does not satisfy a tolerance range of a desired pattern, based on results of the simulation (NG), (B27), preparing second mask data including a second curvilinear shape by correcting the bias-added preliminary mask data through application of at least two selected from a second elliptical function, a second B-spline curve, and second inverse lithography technology (ILT) (B23'), simulating the second mask data (B25), and forming a mask pattern on a mask substrate on the basis of the second mask data when a second expected contour satisfies the tolerance range of the desired pattern, based on results of the simulation (G), (B31).

In an embodiment, addition of the bias to the preliminary mask data (B27), preparation of the second mask data (B23'), and simulation of the second mask data (B25) performed when the first expected contour does not satisfy the tolerance range of the desired pattern, based on results of the simulation (NG), may be iterated or repeated a plurality of times until the second expected contour satisfies the tolerance range of the desired pattern. That is, preparing the mask data including the curvilinear shape (B23') may be an iterative process involving one or more simulation operations (B25) and bias addition operations (B27) depending on the results of the simulation operations (B25).

Figure 24:
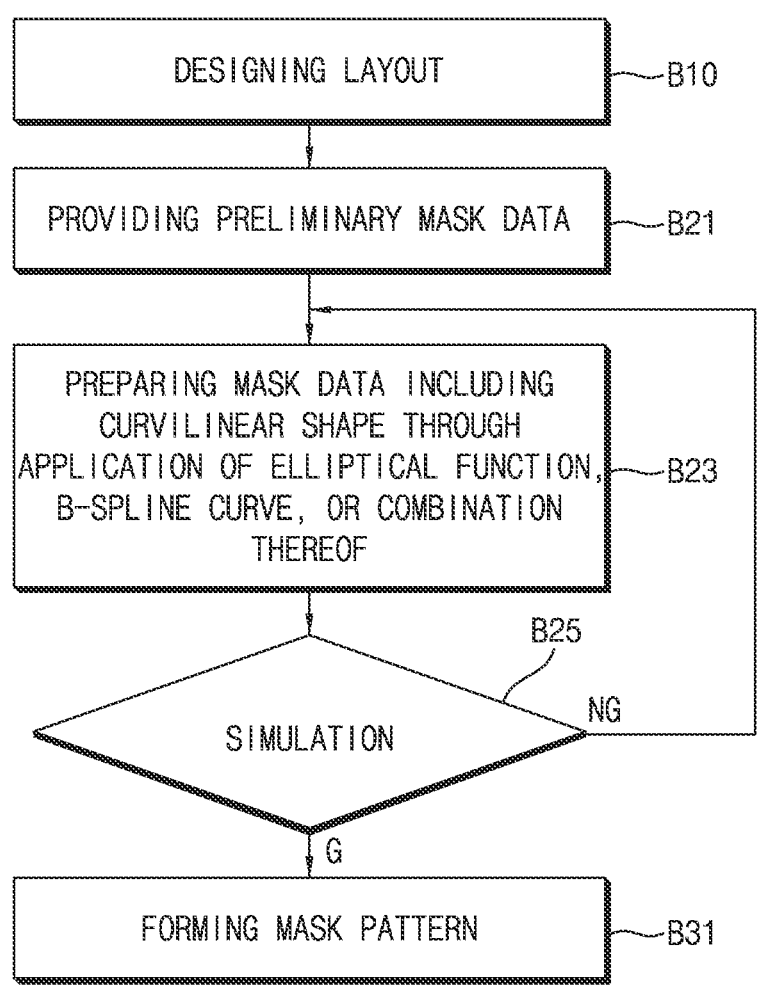
FIG. 24 is a flowchart illustrating a mask forming method according to example embodiments of the disclosure.

FIG. 24 is a flowchart illustrating a mask forming method according to example embodiments of the disclosure.

Referring to FIG. 24, the mask forming method according to the example embodiments of the disclosure may include designing a layout (B10), providing preliminary mask data including a Manhattan path such as a quadrangle, a bar, a polygon, or a combination thereof on the basis of the layout (B21), preparing mask data including a curvilinear shape by correcting the preliminary mask data through application of an elliptical function, a B-spline curve, or a combination thereof (B23), simulating the mask data (B25), and forming a mask pattern on a mask substrate on the basis of the mask data when an expected contour satisfies a tolerance range of a desired pattern, based on results of the simulation (G), (B31).

In an embodiment, the mask forming method according to the example embodiments of the disclosure may include designing a layout (B10), providing preliminary mask data on the basis of the layout (B21), preparing first mask data including a first curvilinear shape by correcting the preliminary mask data through application of a first elliptical function, a first B-spline curve, or a combination thereof (B23), simulating the first mask data (B25), preparing second mask data including a second curvilinear shape by correcting the preliminary mask data through application of a second elliptical function created through correction of the first elliptical function, a second B-spline curve created through correction of coordinates of the first B-spline curve, or a combination thereof when a first expected contour does not satisfy a tolerance range of a desired pattern, based on results of the simulation (NG), (B23), simulating the second mask data (B25), and forming a mask pattern on a mask substrate on the basis of the second mask data when a second expected contour satisfies the tolerance range of the desired pattern, based on the results of the simulation (G), (B31).

In an embodiment, preparation of the second mask data (B23), and simulation of the second mask data (B25) performed when the first expected contour does not satisfy the tolerance range of the desired pattern, based on results of the simulation (NG), may be iterated or repeated a plurality of times until the second expected contour satisfies the tolerance range of the desired pattern. That is, preparing the mask data including the curvilinear shape (B23) may be an iterative process involving one or more simulation operations (B25) and correction of the applied elliptical functions and/or B-spline curves depending on the results of the simulation operations (B25).

FIGS. 25 to 30 are layouts illustrating a mask forming method according to example embodiments of the disclosure.

Figure 25:
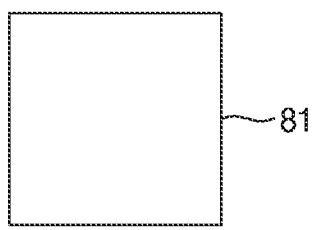
FIGS. 25 to 32 are layouts illustrating a mask forming method according to example embodiments of the disclosure.

Referring to FIGS. 24 and 25, preliminary mask data 81 including a Manhattan path such as a quadrangle, a bar, a polygon, or a combination thereof on the basis of a layout (B21). In an embodiment, the preliminary mask data 81 may include a quadrangle. In an embodiment, the preliminary mask data 81 may include a square.

Figure 26:
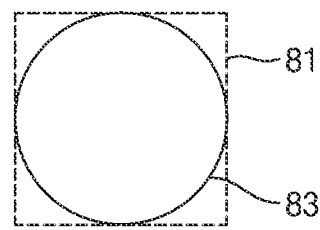

Referring to FIGS. 24 and 26, first mask data 83 including a first curvilinear shape may be prepared by correcting the preliminary mask data 81 through application of a first elliptical function, a first B-spline curve, or a combination thereof (B23). In an embodiment, the first mask data 83 including the first curvilinear shape may include an ellipse inscribed the quadrangle. In an embodiment, the first mask data 83 may include a circle inscribed in the square.

Figure 27:
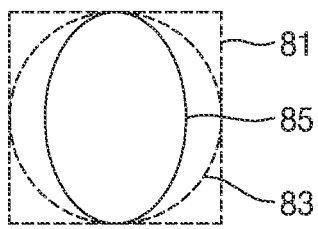

Referring to FIGS. 24 and 27, the first mask data 83 may be simulated (B25). The simulation may include acquiring, from the first mask data 83, a first expected contour 85 formable on a semiconductor substrate, and verifying whether or not the first expected contour 85 is within a tolerance range of a desired pattern. In an embodiment, the first expected contour 85 may include an ellipse smaller than the first mask data 83. In an embodiment, verification of the first expected contour 85 may include checking whether or not the first expected contour 85 is suitable for an EPE tolerance. Verification of the first expected contour 85 may include MRC.

Figure 28:
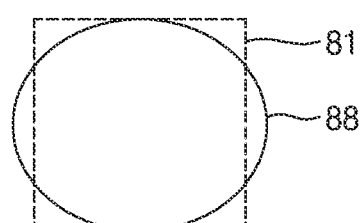

Referring to FIGS. 24 and 28, when the first expected contour 85 does not satisfy the tolerance range of the desired pattern, based on results of the simulation (NG), second mask data 88 including a second curvilinear shape may be prepared by correcting the preliminary mask data 81 through application of a second elliptical function created through correction of coordinates of the first elliptical function, a second B-spline curve created through correction of the first B-spline curve, or a combination thereof (B23). In an embodiment, the second mask data 88 may include an ellipse partially extended to the outside of the preliminary mask data 81. In an embodiment, the second elliptical function may be acquired through correction of intercept coordinates of the first elliptical function.

Figure 29:
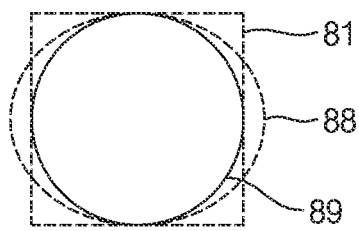

Referring to FIGS. 24 and 29, the second mask data 88 may be simulated (B25). The simulation may include acquiring, from the second mask data 88, a second expected contour 89 formable on a semiconductor substrate, and verifying whether or not the second expected contour 89 is within a tolerance range of a desired pattern. In an embodiment, the second expected contour 89 may include an ellipse smaller than the second mask data 88. In an embodiment, the second expected contour 89 may include a circle smaller than the second mask data 88. In an embodiment, verification of the second expected contour 89 may include verifying whether or not the second expected contour 89 is suitable for an EPE tolerance. Verification of the second expected contour 89 may include MRC.

In an embodiment, preparation of the second mask data 88 (B23) and simulation of the second mask data 88 (B25) as performed when the first expected contour 85 does not satisfy the tolerance range of the desired pattern based on results of the simulation (NG) may be iterated or repeated a plurality of times until the second expected contour 89 satisfies the tolerance range of the desired pattern.

Figure 30:
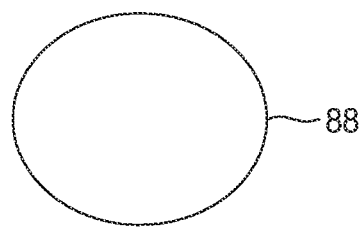

Referring to FIGS. 24 and 30, when the second expected contour 89 satisfies the tolerance range of the desired pattern (G), a mask pattern may be formed on the mask substrate on the basis of the second mask data 88 (B31).

In an embodiment, when the first expected contour 85 satisfies the tolerance range of the desired pattern, based on the results of the simulation (G), a mask pattern may be formed on the mask substrate on the basis of the first mask data 83 (B31). That is, the operations for preparing the second mask data (B23) by correcting an elliptical function and/or B-spline curve and simulating the second mask data (B25) may not be performed when the first expected contour 85 satisfies the tolerance range of the desired pattern.

Figure 31:
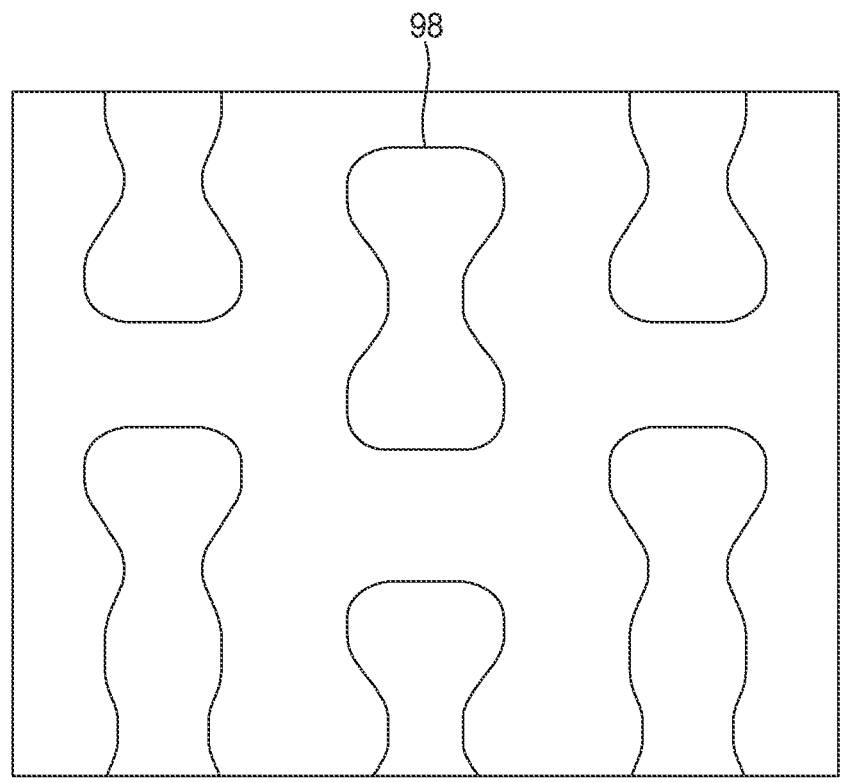
Figure 32:
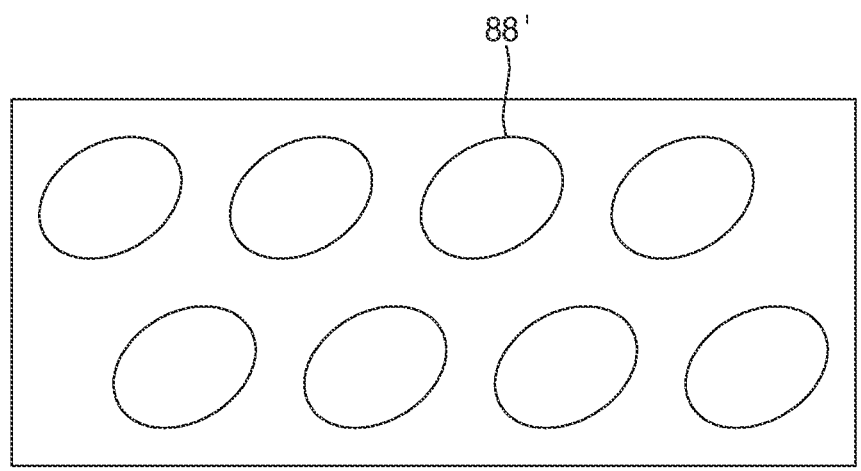

FIGS. 31 and 32 are layouts illustrating a mask forming method according to example embodiments of the disclosure.

Referring to FIGS. 31 and 32, the mask forming method according to the example embodiments of the disclosure may include preparing mask data 88' and 98 having various shapes and various arrangements. For example, the mask data 88' and 98 may include first mask data 88' and second mask data 98 which have repetitive arrangements, respectively. In an embodiment, the first mask data 88' may be prepared through application of a rotation matrix to the second mask data ("88" in FIG. 28).

Figure 33:
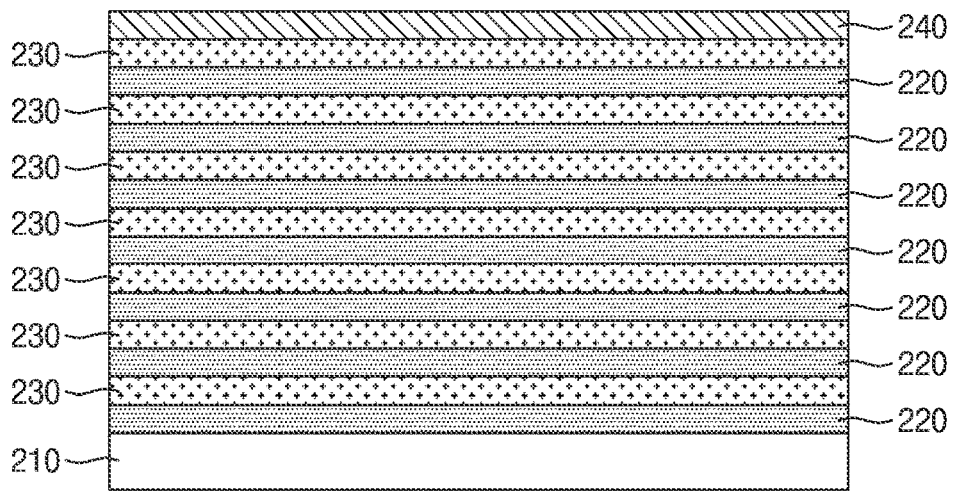
FIGS. 33 to 35 are sectional views illustrating a mask forming method according to example embodiments of the disclosure.
Figure 34:
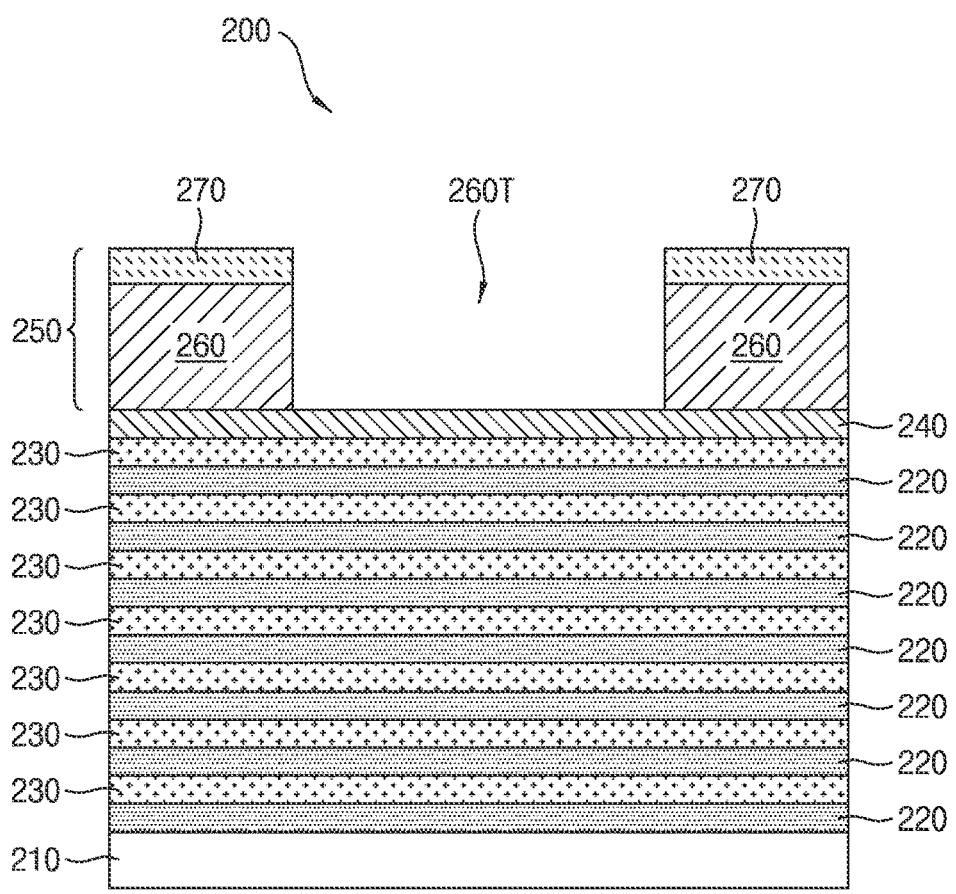
Figure 35:
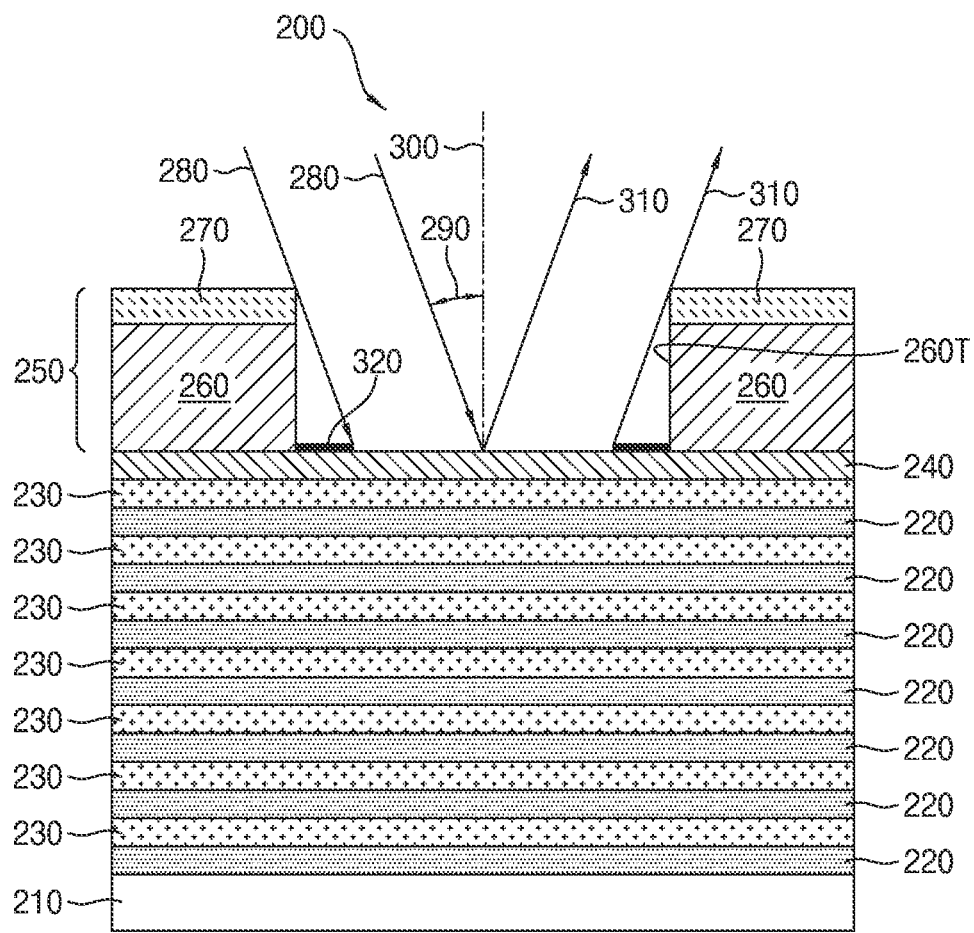

FIGS. 33 to 35 are sectional views illustrating a mask forming method according to example embodiments of the disclosure.

Referring to FIG. 33, the method of forming a mask in accordance with the example embodiments of the disclosure may include forming a reflective layer 220 and 230 on a mask substrate 210, and forming a capping layer 240 on the reflective layer 220 and 230.

In an embodiment, the mask may be an extreme ultraviolet (EUV) lithography mask. The mask substrate 210 may include a silicon layer. The reflective layer 220 and 230 may be a plurality of first material layers 220 and a plurality of second material layers 230 which are repeatedly alternately stacked. The reflective layer 220 and 230 may be the plurality of first material layers 220 and the plurality of second material layers 230 which are stacked in an alternating and/or interleaving manner. The plurality of second material layers 230 may include a material different from the plurality of first material layers 220. Each of the plurality of first material layers 220 may include a silicon layer. Each of the plurality of second material layers 230 may include a silicon layer. Each of the plurality of second material layers 230 may include a molybdenum (Mo) layer. The capping layer 240 may include a ruthenium (Ru) layer.

Referring to FIG. 34, a mask pattern 250 may be formed on the capping layer 240. A mask 200 may include the mask pattern 250, the capping layer 240, the reflective layer 220 and 230, and the mask substrate 210. The mask pattern 250 may be formed on the basis of the mask data described with reference to FIGS. 1 to 32.

Formation of the mask pattern 250 on the capping layer 240 may include a thin film formation process and a patterning process. The mask pattern 250 may include an absorbent 260, an anti-reflective layer 270, and an opening 260T. The absorbent 260 may directly contact the capping layer 240. The absorbent 260 may include tantalum boron nitride (TaBN). The anti-reflective layer 270 may cover at least a top surface of the absorbent 260. The anti-reflective layer 270 may include lawrencium (Lr). The opening 260T may extend through the anti-reflective layer 270 and the absorbent 260 to expose an upper surface of the capping layer 240.

Referring to FIG. 35, the mask may be an extreme ultraviolet (EUV) mask. In an embodiment, in an EUV lithography system, light 280 (for example, EUV radiation beams generated by a light source device) may be projected toward the mask 200 at an inclined incidence angle. As the light 280 is projected toward the mask 200 in an inclined manner, the light 280 may form an incidence angle 290 with respect to a vertical axis 300 perpendicular to a surface of the mask 200. In an embodiment, when the incidence angle 290 ranges from about 5° to about 7°, reflected light 310 may be projected toward a projection optical system (not shown) in order to perform an EUV lithography process. A shadow region 320 may be generated at the surface of the mask 200 due to a height of the mask pattern 250. The shadow region 320 may be reflected or accounted for in preparation of mask data (B23 and B23'), execution of a simulation (B25), and/or addition of a bias (B27) described with reference to FIGS. 1 to 32.

In an embodiment, the mask 200 may be a light-transmissive mask. The mask substrate 210 may include a light-transmissive substrate such as quartz. The reflective layers 220 and 230 and the capping layer 240 may be omitted. The mask pattern 250 may include a light shielding layer such as a chromium (Cr) layer.

Figure 36:
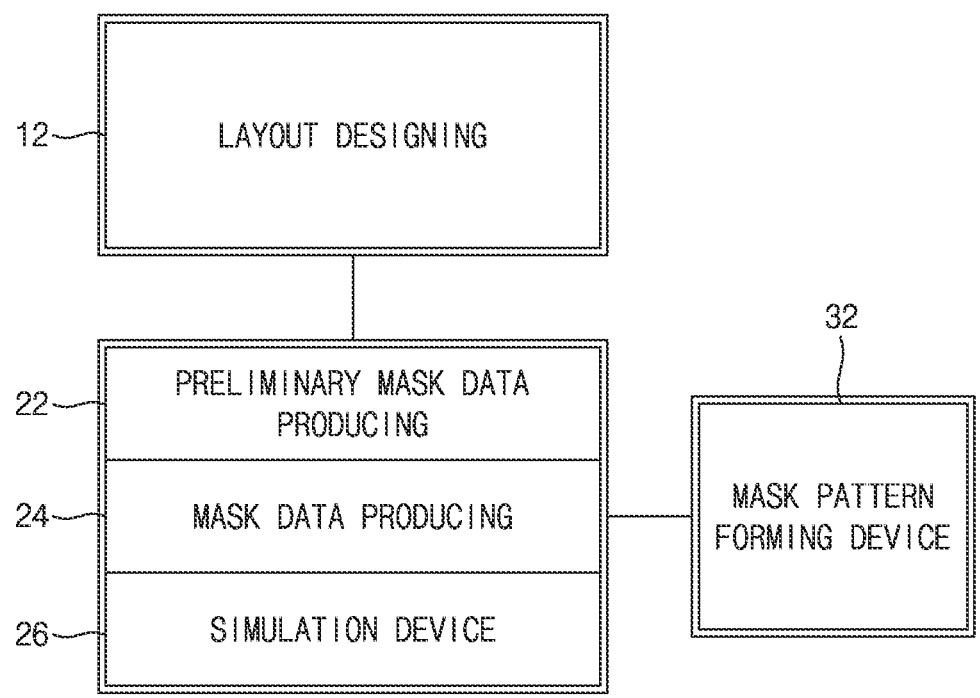
FIG. 36 is a diagram illustrating a mask forming system according to example embodiments of the disclosure.

FIG. 36 is a diagram illustrating a mask forming system according to example embodiments of the disclosure. In an embodiment, the mask forming system may be an extreme ultraviolet (EUV) lithography mask forming system.

Referring to FIG. 36, the mask forming system according to the example embodiments of the disclosure may include a layout designing device 12, a preliminary mask data producing device 22, a mask data producing device 24, a simulation device 26, and a mask pattern forming device 32. One or more of the devices 12, 22, 24, 28, and 32 may include and/or may be controlled by a computing device including at least one processing unit that is configured to execute computer-readable program code stored in a non-transitory computer readable storage medium to perform one or more of the operations described with reference to the flowcharts herein. That is, each block of the flowcharts, and/or combinations of blocks in the flowcharts, may be implemented by computer program instructions and/or hardware operations, and may be provided to a computing device or other programmable data processing apparatus to cause a series of operational steps to be performed by the computing device to produce a computer implemented process.

The layout designing device 12 may perform a function of designing a layout (B10) described with reference to FIGS. 1, 23 and 24. The preliminary mask data producing device 22 may be connected to the layout designing device 12 and may be configured to receive input signals therefrom. The preliminary mask data producing device 22 may perform a function of providing preliminary mask data on the basis of the layout input from the layout designing device 12 (B21) described with reference to FIGS. 1, 23 and 24.

The mask data producing device 24 may be disposed adjacent to the preliminary mask data producing device 22. The mask data producing device 24 may be connected to the preliminary mask data producing device 22 and may be configured to receive input signals therefrom. The mask data producing device 24 may perform a function of preparing mask data (B23 and B23') described with reference to FIGS. 1, 23 and 24. For example, the mask data producing device 24 may perform a function of preparing the mask data, which includes a curvilinear shape, by correcting the preliminary mask data provided as an output signal from the device 22 through application of at least one selected from an elliptical function and a B-spline curve, or through application of at least two selected from the elliptical function, the B-spline curve, and inverse lithography technology (ILT).

The simulation device 26 may be disposed adjacent to the mask data producing device 24. The simulation device 26 may be connected to the mask data producing device 24 and may be configured to receive input signals therefrom. The simulation device 26 may perform a function of simulating the mask data (B25) described with reference to FIGS. 1, 23 and 24.

In an embodiment, the preliminary mask data producing device 22, the mask data producing device 24, and the simulation device 26 may be embodied using an arithmetic operation device such as a workstation or other computing device to which multiple users can connect in parallel.

In an embodiment, the layout designing device 12, the preliminary mask data producing device 22, the mask data producing device 24, and the simulation device 26 may be embodied using an arithmetic operation device such as a workstation or other computing device to which multiple users can connect in parallel.

The mask pattern forming device 32 may be connected to the mask data producing device 24 and/or the simulation device 26 and may be configured to receive inputs therefrom. The mask pattern forming device 32 may perform a function of forming a mask pattern on a mask substrate on the basis of the mask data (B31). The mask pattern forming device 32 may include a thin film forming device and a patterning device.

Figure 37:
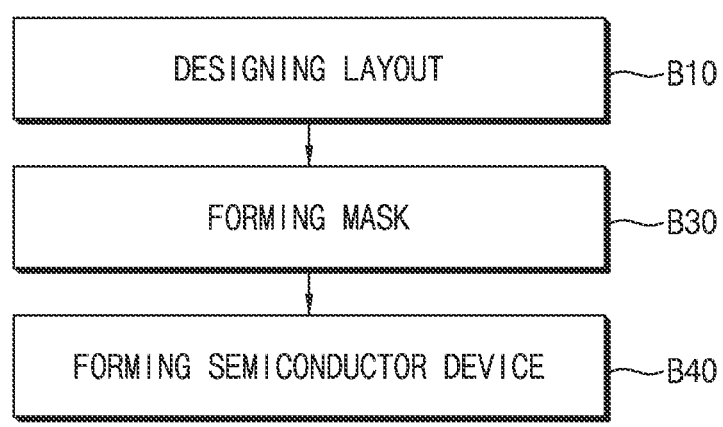
FIG. 37 is a flowchart illustrating a semiconductor device forming method according to example embodiments of the disclosure.

FIG. 37 is a flowchart illustrating a semiconductor device forming method according to example embodiments of the disclosure.

Referring to FIG. 37, the semiconductor device forming method according to the example embodiments of the disclosure may include designing a layout (B10), forming a mask (B30), and forming a semiconductor device (B40). Formation of the mask (B30) may be performed using methods and devices similar to those described with reference to FIGS. 1 to 36.

Formation of the semiconductor device (B40) may include preparing a semiconductor substrate, and forming a plurality of semiconductor patterns on the semiconductor substrate. Formation of the plurality of semiconductor patterns may include a thin film formation process and a lithography process. The lithography process may use a lithography device and the mask. In an embodiment, the lithography device may include an extreme ultraviolet (EUV) lithography device. The mask may include an EUV lithography mask.

In accordance with the example embodiments of the disclosure, mask data including a curvilinear shape is prepared by correcting preliminary mask data through application and/or correction of an elliptical function, a B-spline curve, or a combination thereof. A mask pattern may be formed on a mask substrate on the basis of the mask data. System resources required for preparation of the mask data may be considerably reduced in accordance with application of the elliptical function, the B-spline curve or a combination thereof. A rapid and efficient mask forming system may be realized.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A mask forming method comprising:
providing preliminary mask data comprising a first Manhattan path that defines a quadrangle, a bar, a polygon, or a combination thereof, based on a layout;
preparing first mask data comprising a first curvilinear shape by correcting the preliminary mask data such that the first curvilinear shape includes a first portion that is inscribed in the first Manhattan path using a first elliptical function, a first B-spline curve, or a combination thereof;
simulating the first mask data to generate a first expected contour;
adding a bias to the preliminary mask data responsive to the simulating to provide bias-added preliminary mask data, wherein the bias-added preliminary mask data comprises a bias-added Manhattan path;
preparing second mask data comprising a second curvilinear shape by correcting the bias-added preliminary mask data such that the second curvilinear shape includes a second portion that is inscribed in the bias-added Manhattan path using a second elliptical function, a second B-spline curve, or a combination thereof; and
forming a mask pattern on a mask substrate based on the second mask data that was prepared.

2. The mask forming method according to claim 1, wherein the second portion of the second curvilinear shape extends outside of the first Manhattan path but is confined inside of the bias-added Manhattan path.

3. The mask forming method according to claim 1, wherein the bias comprises partial addition of a quadrangle, partial deletion of a quadrangle, a hammer-head, a serif, a jog, or a combination thereof.

4. The mask forming method according to claim 1, wherein the first expected contour is smaller than the first curvilinear shape.

5. The mask forming method according to claim 1, further comprising:
forming a reflective layer on the mask substrate; and
forming a capping layer on the reflective layer,
wherein the mask pattern is on the capping layer, and
wherein the reflective layer comprises a plurality of first material layers and a plurality of second material layers which are repeatedly alternately stacked.

6. The mask forming method according to claim 5, wherein:
the mask substrate comprises a silicon layer;
each of the plurality of first material layers comprises a silicon layer;
each of the plurality of second material layers comprises a molybdenum (Mo) layer; and
the capping layer comprises a ruthenium (Ru) layer.

7. The mask forming method according to claim 5, wherein the mask pattern comprises:
an absorbent on the capping layer; and
an opening extending through the absorbent to expose an upper surface of the capping layer.

8. The mask forming method according to claim 7, wherein the absorbent comprises tantalum boron nitride (TaBN).

9. The mask forming method according to claim 7, further comprising:
an anti-reflective layer on the absorbent,
wherein the anti-reflective layer comprises lawrencium (Lr).

10. The mask forming method according to claim 1, wherein:
the mask substrate comprises a light-transmissive substrate; and
the mask pattern comprises a light shielding layer.

11. The mask forming method according to claim 1, wherein:
the mask substrate comprises quartz; and
the mask pattern comprises chromium (Cr).

12. The mask forming method according to claim 1, wherein:
the mask substrate comprises an extreme ultraviolet (EUV) mask substrate; and
the mask pattern comprises an EUV mask pattern.

13. A semiconductor device forming method comprising:
forming a mask; and
forming a plurality of semiconductor patterns on a semiconductor substrate using the mask,
wherein the forming the mask comprises:
providing preliminary mask data comprising a Manhattan path that defines a quadrangle, a bar, a polygon, or a combination thereof, based on a layout;
preparing first mask data comprising a first curvilinear shape by correcting the preliminary mask data such that the first curvilinear shape includes a first portion that is inscribed in the Manhattan path using a first elliptical function, a first B-spline curve, or a combination thereof;
simulating the first mask data to generate a first expected contour, wherein the first expected contour does not satisfy a tolerance range;
preparing second mask data comprising a second curvilinear shape by correcting the preliminary mask data using a second elliptical function, a second B-spline curve, or a combination thereof, wherein the second curvilinear shape includes a second portion that is outside of the Manhattan path of the preliminary mask data; and
forming a mask pattern on a mask substrate based on the second mask data that was prepared.

14. The semiconductor device forming method according to claim 13, wherein:
the forming the plurality of semiconductor patterns comprises a thin film formation process and a lithography process; and
the lithography process uses a lithography device and the mask.

15. The semiconductor device forming method according to claim 14, wherein:
the lithography device comprises an extreme ultraviolet (EUV) lithography device; and
the mask comprises an EUV lithography mask.

16. The semiconductor device forming method according to claim 13, wherein
the second elliptical function is created through correction of coordinates of the first elliptical function, and the second B-spline curve is created through correction of coordinates of the first B-spline curve.

17. A mask forming method comprising:
providing preliminary mask data comprising a first Manhattan path that defines a quadrangle, a bar, a polygon, or a combination thereof, based on a layout;
preparing first mask data comprising a first curvilinear shape by correcting the first Manhattan path of the preliminary mask data such that the first curvilinear shape includes a first portion that is inscribed in the first Manhattan path using at least two selected from a group consisting of a first elliptical function, a first B-spline curve, and a first inverse lithography technology (ILT);

preparing second mask data comprising a second curvilinear shape based on the preliminary mask data, wherein the second curvilinear shape includes a second portion that is outside of the first Manhattan path; and forming a mask pattern on a mask substrate based on the second mask data that was prepared.

18. The mask forming method according to claim 17, further comprising:

simulating the first mask data to generate a first expected contour; and adding a bias to the preliminary mask data responsive to the simulating to provide bias-added preliminary mask data, wherein the bias-added preliminary mask data comprises a bias-added Manhattan path, wherein the second curvilinear shape is created by correcting the bias-added preliminary mask data using at least two selected from a group consisting of a second elliptical function, a second B-spline curve, and a second inverse lithography technology (ILT), and wherein the second portion of the second curvilinear shape extends outside of the first Manhattan path but is confined inside of the bias-added Manhattan path.

19. The mask forming method according to claim 17, further comprising:

simulating the first mask data to generate a first expected contour, wherein the first expected contour does not satisfy a tolerance range, wherein the second curvilinear shape is created by correcting the preliminary mask data through application of at least two selected from a group consisting of a second elliptical function created through correction of coordinates of the first elliptical function, a second B-spline curve created through correction of coordinates of the first B-spline curve, and a second inverse lithography technology (ILT).

* * * * *